United States Patent
Yoshida et al.

(10) Patent No.: US 11,094,539 B2
(45) Date of Patent: Aug. 17, 2021

(54) METHOD FOR MANUFACTURING NITRIDE SEMICONDUCTOR SUBSTRATE AND NITRIDE SEMICONDUCTOR SUBSTRATE

(71) Applicants: SCIOCS COMPANY LIMITED, Ibaraki (JP); SUMITOMO CHEMICAL COMPANY, LIMITED, Tokyo (JP)

(72) Inventors: Takehiro Yoshida, Ibaraki (JP); Fumimasa Horikiri, Ibaraki (JP)

(73) Assignees: SCIOCS COMPANY LIMITED, Ibaraki (JP); SUMITOMO CHEMICAL COMPANY, LIMITED, Tokyo (JP)

(*) Notice: Subject to any disclaimer, the term of this patent is extended or adjusted under 35 U.S.C. 154(b) by 0 days.

(21) Appl. No.: 16/490,704

(22) PCT Filed: Feb. 28, 2018

(86) PCT No.: PCT/JP2018/007392
§ 371 (c)(1),
(2) Date: Sep. 3, 2019

(87) PCT Pub. No.: WO2018/159646
PCT Pub. Date: Sep. 7, 2018

(65) Prior Publication Data
US 2020/0006049 A1   Jan. 2, 2020

(30) Foreign Application Priority Data
Mar. 3, 2017   (JP) .............................. JP2017-040144

(51) Int. Cl.
*H01L 21/02* (2006.01)
*H01L 29/20* (2006.01)
(Continued)

(52) U.S. Cl.
CPC .... *H01L 21/0254* (2013.01); *H01L 21/02609* (2013.01); *H01L 21/02636* (2013.01);
(Continued)

(58) Field of Classification Search
CPC .......... H01L 21/0254; H01L 21/02609; H01L 21/02636; H01L 21/02664; H01L 21/2654; H01L 29/045; H01L 29/2003
See application file for complete search history.

(56) References Cited

U.S. PATENT DOCUMENTS 7,872,285 B2 * 1/2011 Hashimoto ......... H01L 29/0878
257/263
10,770,552 B2 * 9/2020 Ichimura ............... H01L 29/778
(Continued)

FOREIGN PATENT DOCUMENTS

JP    2007-153664 A    6/2007
JP    2009-126722 A    6/2009
(Continued)

OTHER PUBLICATIONS

International Search Report issued in Application No. PCT/JP2018/007392 dated May 29, 2018.
(Continued)

*Primary Examiner* — Christine A Enad
(74) *Attorney, Agent, or Firm* — Pearne & Gordon LLP

(57) ABSTRACT

A nitride semiconductor substrate is manufactured by a method which includes growing nitride semiconductor crystal along a c-axis direction on a +C-plane of a seed crystal substrate formed of nitride semiconductor crystal to form an n⁻-type first nitride semiconductor layer; growing the nitride semiconductor crystal along the c-axis direction on the +C-plane of the first nitride semiconductor layer to form a second nitride semiconductor layer; and removing the seed crystal substrate and exposing a −C-plane of the first nitride
(Continued)

semiconductor layer to obtain as a semiconductor substrate a laminate of the first nitride semiconductor layer and the second nitride semiconductor layer, with the –C plane as a main surface.

9 Claims, 10 Drawing Sheets

(51) Int. Cl.
  *H01L 29/04* (2006.01)
  *H01L 21/265* (2006.01)
(52) U.S. Cl.
  CPC .... *H01L 21/02664* (2013.01); *H01L 21/2654* (2013.01); *H01L 29/045* (2013.01); *H01L 29/2003* (2013.01)

(56) References Cited

U.S. PATENT DOCUMENTS

| | | | |
|---|---|---|---|
| 2005/0164419 A1 | 7/2005 | Hirota et al. | |
| 2008/0001165 A1 | 1/2008 | Hashimoto et al. | |
| 2008/0315245 A1 | 12/2008 | Oshima | |
| 2009/0127662 A1 | 5/2009 | Okahisa et al. | |
| 2009/0137098 A1* | 5/2009 | Sakamoto | H01S 5/22 438/462 |
| 2010/0163931 A1* | 7/2010 | Fujioka | H01L 21/02403 257/200 |
| 2011/0012109 A1* | 1/2011 | Kryliouk | H01L 21/02433 257/49 |
| 2011/0198610 A1 | 8/2011 | Fujikura | |
| 2011/0309400 A1* | 12/2011 | Fukushima | H01L 21/02381 257/98 |
| 2013/0069032 A1* | 3/2013 | Kushibe | H01L 33/32 257/13 |
| 2016/0254391 A1* | 9/2016 | Kinoshita | H01L 21/02389 257/76 |
| 2020/0411647 A1* | 12/2020 | Matsuyama | H01L 29/7786 |

FOREIGN PATENT DOCUMENTS

| | | |
|---|---|---|
| JP | 2009-541997 A | 11/2009 |
| JP | 2010-89971 A | 4/2010 |
| JP | 2011-037704 A | 2/2011 |
| JP | 2011-162407 A | 8/2011 |
| JP | 2013-84783 A | 5/2013 |
| JP | 2016-092083 A | 5/2016 |
| WO | 2015056714 A1 | 4/2015 |

OTHER PUBLICATIONS

Written Opinion issued in Application No. PCT/JP2018/007392 dated May 29, 2018.

Okumura, Hironori, et al., "Growth diagram of N-face GaN (0001) grown at high rate by plasma-assisted molecular beam epitaxy", Applied Physics Letters, 104, 012111 (2014), pp. 1-5, AIP Publishing LLC.

English Translation of the International Preliminary Report on Patentability and Written Opinion for PCT/JP2018/007392 (dated Sep. 12, 2019).

* cited by examiner

METHOD FOR MANUFACTURING NITRIDE SEMICONDUCTOR SUBSTRATE AND NITRIDE SEMICONDUCTOR SUBSTRATE

TECHNICAL FIELD

The present invention relates to a method for manufacturing a nitride semiconductor substrate, and a nitride semiconductor substrate.

DESCRIPTION OF RELATED ART

A semiconductor device such as a light emitting element or a high-speed transistor is constituted, for example, using a nitride semiconductor substrate formed of crystal of group-III nitride such as gallium nitride (GaN) in some cases (see, Patent Document 1).

RELATED ART DOCUMENT

Patent Documents

[Patent Document 1] Japanese Unexamined Patent Application Publication No. 2007-153664

BRIEF SUMMARY OF THE INVENTION

Problems to be Solved by the Invention

An object of the present invention is to provide a technology relating to a method for manufacturing a nitride semiconductor substrate suitable for constituting a semiconductor device, and a nitride semiconductor substrate.

Means for Solving the Problem

According to an aspect of the present invention, there is provided a method for manufacturing a nitride semiconductor substrate including:

growing nitride semiconductor crystal along a c-axis direction on a +C-plane of a seed crystal substrate formed of nitride semiconductor crystal to form an n⁻-type first nitride semiconductor layer;

growing the nitride semiconductor crystal along the c-axis direction on the +C-plane of the first nitride semiconductor layer to form a second nitride semiconductor layer; and removing the seed crystal substrate and exposing a −C-plane of the first nitride semiconductor layer to obtain as a semiconductor substrate a laminate of the first nitride semiconductor layer and the second nitride semiconductor layer, with the −C plane as a main surface.

Moreover, according to another aspect of the present invention, there is provided a nitride semiconductor substrate constituted by laminated first and second nitride semiconductor layers formed of nitride semiconductor crystal, wherein the first nitride semiconductor layer is of n⁻-type having a −C-plane as an exposed plane, and an n-type impurity concentration in the nitride semiconductor crystal is less than $1 \times 10^{17}$ at/cm³.

Advantage of the Invention

According to the present invention, a nitride semiconductor substrate is obtained which is suitably used for constitution of a semiconductor device.

DETAILED DESCRIPTION OF THE INVENTION

<Findings of the Inventors>

Figure 1:
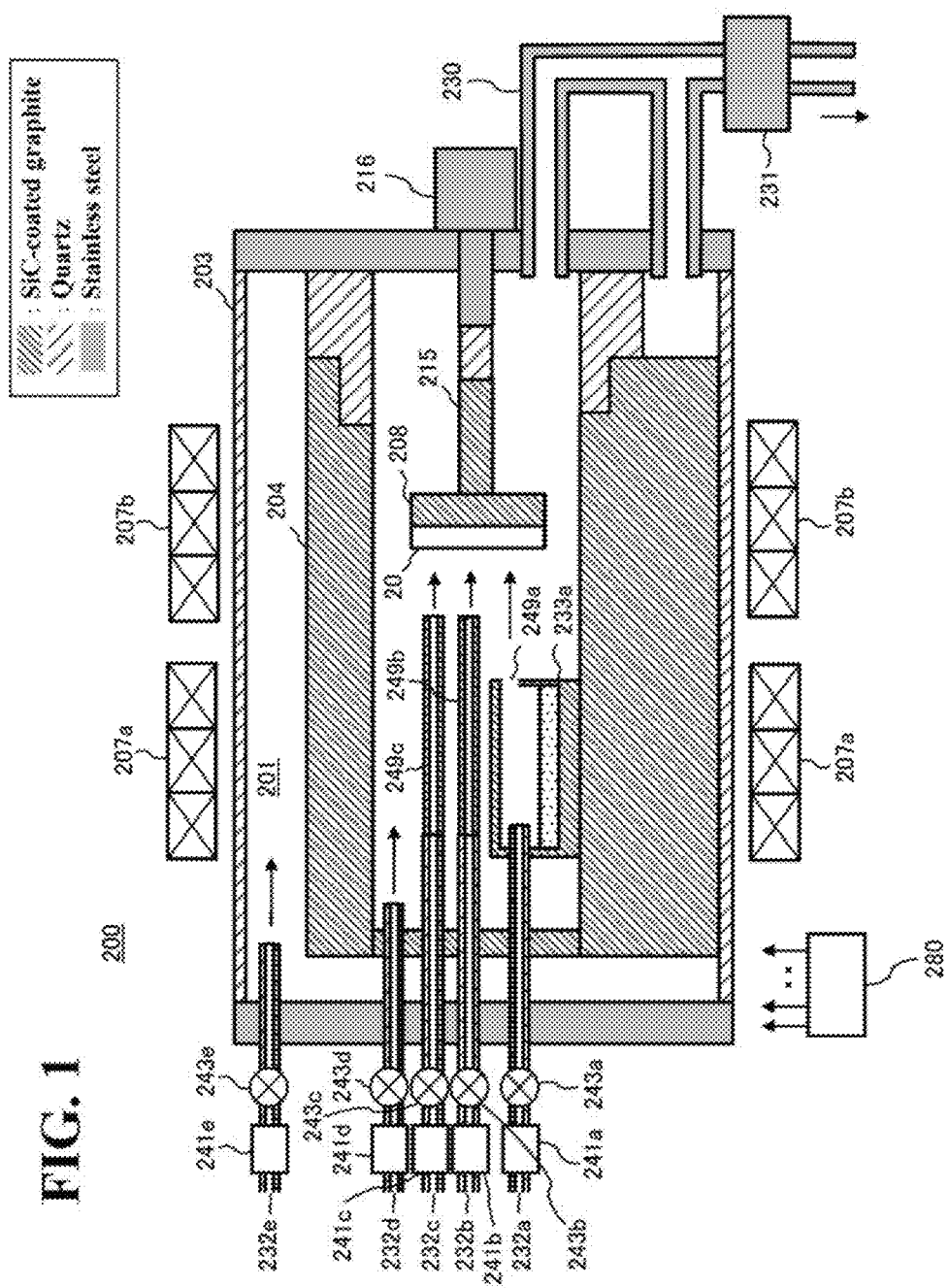
FIG. 1 is a schematic block diagram illustrating a specific example of a vapor phase epitaxy apparatus which is used in a method for manufacturing a nitride semiconductor substrate according to the present invention.

As a nitride semiconductor substrate for constituting a semiconductor device such as a light emitting element or a high-speed transistor, a substrate formed of GaN-single crystal (hereinafter also referred to as a "GaN substrate") is attracting attention. In the case of constituting a semiconductor device using a GaN substrate, for example, the following method is used in some cases: a p-type impurity such as magnesium (Mg) is implanted into the GaN substrate by ion-implantation to form a p-type region in the GaN substrate. In this case, since ion-implantation into the GaN substrate requires an annealing in a high temperature region above 1200° C. after implantation, thermal decomposition of the GaN-crystal may become problematic. However, it is considered that ion-implantation is performed into a nitrogen (N) polar plane which is more thermally stable than a gallium (Ga) polar plane will solve the problem on thermal decomposition of the GaN-crystal and enable formation of a pn-junction diode which exhibits a good rectifying property.

In the GaN-crystal into which the ion-implantation is performed, it is preferred that the concentration of impurity such as silicon (Si) or oxygen (O) in the GaN-crystal is extremely low. It is because, with such an extremely low impurity concentration in the GaN-crystal, a desired conductive property (p-type semiconductor property) may be imparted to the GaN-crystal even when an amount of the Mg to be implanted is suppressed to low. In other words, compared to the case where more impurity such as Si and O are contained, since the impurity concentration in the GaN-crystal into which the ion-implantation is performed is suppressed, a desired semiconductor property can be imparted while suppressing reduction in the crystal quality due to Mg implantation as much as possible. Further, the extremely low concentration of the impurity which causes a carrier scattering is also more advantageous in that reduction in a carrier mobility can be avoided compared to the case where a larger amount of impurity is contained.

However, it is very difficult to grow the GaN crystal in the direction of the N-polar plane (i.e., −C-plane) compared to the case to grow it in the direction of the Ga polar plane (i.e., +C-plane). Furthermore, in the case to grow in the direction of the N-polar plane, the incorporation of impurities such as O is intense in the growth process, and the impurity concentration cannot be suppressed to extremely low. In other words, when the GaN-crystal is grown in the direction of the N polar plane, the GaN substrate cannot be obtained which is constituted to have, as an exposed plane, a N polar plane (−C-plane) into which the ion-implantation can be performed, and to have an extremely low impurity concentration in the GaN-crystal into which the ion-implantation is to be performed.

In this regard, the present inventors studied intensively, and obtained a new finding that a GaN substrate can be constituted to have as an exposed plane a N polar plane (−C-plane) into which ion-implantation can be performed and to have an extremely low impurity concentration in the GaN crystal into which the ion-implantation is to be performed by devising a procedure, etc., of manufacturing a substrate.

The present invention is based on the new findings obtained by the present inventors as described above.

First Embodiment of the Present Invention

A first embodiment of the present invention will be hereinafter explained with reference to drawings.

(1) Method for Manufacturing a Nitride Semiconductor Substrate

First, an example of a method for manufacturing a nitride semiconductor substrate according to the present invention will be explained.

The nitride semiconductor substrate is a plate-like (e.g., disc-like) substrate (hereinafter also referred to as a "wafer") formed of nitride semiconductor crystal.

The nitride semiconductor crystal forming the nitride semiconductor substrate is semiconductor crystal in which N is used as a group-V element in a group III-V compound semiconductor in which a group-III element and a group-V element are used, and is crystal represented by a compositional formula of $In_xAl_yGa_{1-x-y}N$ (wherein $0 \leq x \leq 1$, $0 \leq y \leq 1$, $0 \leq x+y \leq 1$).

Hereafter, in this embodiment, manufacturing the GaN substrate formed of the GaN crystal as the nitride semiconductor crystal is explained by way of an example, in which the nitride semiconductor crystal is GaN-single crystal.

The GaN-crystal forming the GaN substrate has a hexagonal crystal structure (a wurtzite-type crystal structure). In the GaN-crystal having such a hexagonal structure, examples of a plane having polarity (a polar plane) include a {0001} plane which corresponds to a Ga polar plane and a {000-1} plane which corresponds to an N polar plane. In the present specification, the polar plane is referred to as a "C-plane", and particularly the {0001} plane may be referred to as a "+C-plane" and the {000-1} plane may be referred to as a "−C-plane". It should be noted that the reference to a specific index plane of the "C-plane" or the like encompasses a plane having an off angle within 10°, preferably within 5°, and more preferably within 3°, from each crystal axis, which is measured with an accuracy within ±0.01°. Here, the off angle means an angle formed between a normal direction of the plane and an axis direction of the GaN crystal.

(HVPE Apparatus)

In this embodiment, manufacturing the GaN substrate formed of the GaN crystal is performed utilizing a hydride vapor phase epitaxy apparatus (HVPE apparatus). Now, constitution of the HVPE apparatus utilized for manufacturing the GaN substrate will be explained with reference to FIG. 1.

The HVPE apparatus 200 is provided with an airtight vessel 203 having a film-forming chamber 201 constituted therein. In the film-forming chamber 201 is provided an inner cover 204 as well as a susceptor 208 as a base on which a seed crystal substrate 20 is to be placed at the position surrounded by the inner cover 204. The susceptor 208 is connected to a rotary axis 215 of a rotary mechanism 216 and is rotatably constituted corresponding to the driving of the rotary mechanism 216.

A gas supply pipe 232a for supplying hydrogen chloride (HCl) gas into a gas generator 233a, a gas supply pipe 232b for supplying ammonia ($NH_3$) gas into the inner cover 204, a gas supply pipe 232c for supplying a doping gas described later into the inner cover 204, a gas supply pipe 232d for supplying a mixed gas ($N_2/H_2$ gas) of nitrogen ($N_2$) gas and hydrogen ($H_2$) gas as a purge gas into the inner cover 204, and a gas supply pipe 232e for supplying $N_2$ gas as a purge gas into the film-forming chamber 201 are connected to the one end of the airtight vessel 203. The supply pipes 232a to 232e are provided respectively with flow rate controllers 241a to 241e and valves 243a to 243e in this order from upstream side. The gas generator 233a which contains a Ga melt as a raw material is provided downstream of the gas supply pipe 232a. The gas generator 233a is provided with a nozzle 249a which supplies gallium chloride (GaCl) gas produced by the reaction between HCl gas and the Ga melt, for example, toward the seed crystal substrate 20 placed on the susceptor 208. To the downstream side of the gas supply pipes 232b, 232c, nozzles 249b, 249c are connected, which supply various gases supplied from these gas supply pipes, for example, toward the seed crystal substrate 20 placed on the susceptor 208. The nozzles 249a to 249c are arranged so as to flow gas in the direction crossing the surface of the susceptor 208. The doping gas supplied from the nozzle 249c is a mixed gas of a doping source gas and a carrier gas such as $N_2/H_2$ gas. Regarding a doping gas, HCl gas may be flowed together for the purpose of suppressing thermal decomposition of a halide gas in the doping source. As a doping source gas contained in the doping gas, it is contemplated to use, for example but not limited to, $SiH_2Cl_2$ gas for silicon (Si) doping; $GeCl_4$ gas for germanium (Ge) doping; $CH_2Cl_2$ gas for carbon (C) doping; and $FeCl_2$ gas for iron (Fe) doping.

The airtight vessel 203 is provided with an exhaust pipe 230 for exhausting the inside of the film-forming chamber 201 at the other end thereof. The exhaust pipe 230 is provided with a pump (or a blower) 231. The airtight vessel 203 is provided on the outer periphery thereof with zone heaters 207a, 207b for respectively heating the inside of the gas generator 233a and the seed crystal substrate 20 on the susceptor 208 or the like to a temperature desirable for each region. The airtight vessel 203 is also provided with a temperature sensor (not shown) inside thereof for measuring a temperature in the film-forming chamber 201.

The constituent members of the above-described HVPE apparatus 200, particularly individual members for forming various gas flows are, for example, constituted as follows in order to enable crystal growth at a low impurity concentration described later.

Specifically, as identifiably shown with different hatching patterns in FIG. 1, it is preferred that all of members placed in the region exposed to radiation from zone heaters 207a, 207b for heating to a high temperature are constituted by silicon carbide (SiC) coated graphite. On the other hand, in a relatively lower temperature portion, a member is preferably constituted using high-purity quartz. In other words, each member is constituted using SiC coated graphite without using high-purity quartz at a place in contact with HCl gas where the temperature is relatively high (for example, 1000° C. or more). More specifically, the inner cover 204, the susceptor 208, the rotary axis 215, the gas generator 233a, nozzles 249a to 249c and the like are constituted using SiC coated graphite. There is no other choice but to use quartz for a furnace tube constituting the airtight vessel 203. Therefore, the inner cover 204, which surrounds the susceptor 208, the gas generator 233a, and the like, is provided in the film-forming chamber 201. Wall portions at both ends of the airtight vessel 203, the exhaust pipe 230 and the like may be constituted using a metal material such as stainless steel.

For example, "Polyakov et al. J. Appl. Phys. 115, 183706 (2014)" discloses that since growth occurs at 950° C., GaN-crystal with low impurity concentration can be grown. However, such low-temperature growth causes reduction in crystal quality, failing to yield a product excellent in thermophysical properties, electrical properties, and the like. On the other hand, with a HVPE apparatus 200 of the above-described constitution, supply of impurities such as Si, O, C, Fe, Cr, Ni to a crystal growth portion can be blocked even in a temperature region, for example, at 1050° C. or more which is suitable for growth of GaN-crystal, and GaN-crystal having high-purity as well as good thermophysical property and electrical property can be grown.

Members provided in the HVPE apparatus 200 are connected to a controller 280 constituted as a computer and constituted so that the procedures and treatment conditions described later are controlled by the program implemented on the controller 280.

(Outline of GaN-Substrate Manufacturing Procedure)

Next, an example of the procedure for epitaxially growing the GaN-single crystal on the seed crystal substrate 20 using the above-described HVPE apparatus 200 to manufacture a GaN substrate will be explained in detail. In the following explanation, the operation of each part constituting the HVPE apparatus 200 is controlled by the controller 280.

In manufacturing the GaN substrate, a loading step is followed by a crystal growth step, and further by an unloading step and a slicing step. In the crystal growth step, at least a first layer forming step and a second layer forming step are performed.

(Loading Step)

Specifically, a furnace port of the reaction container 203 is opened at first, and the seed crystal substrate 20 is placed on the susceptor 208. The seed crystal substrate 20 placed on the susceptor 208 is to become a base (seed) for manufacturing the GaN substrate 10 described later, and in the form of a plate formed of the GaN-single crystal which is an example of the nitride semiconductor. Of two opposing main surfaces, one main surface is a {0001} plane which corresponds to the Ga polar plane, and the other main surface is a {000-1} plane (i.e., −C-plane) which corresponds to the N polar plane.

In placing the seed crystal substrate 20 on the susceptor 208, the surface of the seed crystal substrate 20 while being mounted on the susceptor 208, that is, the main surface (crystal growth surface, base surface) on the side facing the nozzles 249a to 249c is to be, for example, a {0001} plane, that is, +C-plane (Ga polar plane) of the GaN-crystal.

As the seed crystal substrate 20 to be placed on the susceptor 208, for example, it is contemplated to use a substrate having the concentration of the n-type impurity typified by Si in the GaN-crystal of about $1 \times 10^{18}$ to $1 \times 10^{19}$ at/cm$^3$, that is, a substrate of n$^+$-type having relatively high n-type impurity concentration. In this case, however, it is not necessarily limited to a substrate of n$^-$-type but may be a substrate doped to the n-type impurity concentration of about $1 \times 10^{15}$ to $1 \times 10^{16}$ at/cm$^3$ so long as the first GaN layer 21 can be grown as described later.

It should be noted that a planar shape and a size of the seed crystal substrate 20 are not particularly limited and may be appropriately determined according to a shape, a size, or the like of the GaN substrate 10 to be manufactured. In addition, a thickness of the seed crystal substrate 20 is also not particularly limited and is contemplated to be about 300 to 400 μm which can realize self-standing, considering easy handling when placed on the susceptor 208.

(Crystal Growth Step)

After loading of the seed crystal substrate 20 into the reaction chamber 201 is completed, the crystal growth step is subsequently performed. In the crystal growth step, at least the first layer forming step and the second layer forming step are sequentially performed.

(First Layer Forming Step)

Figure 2:
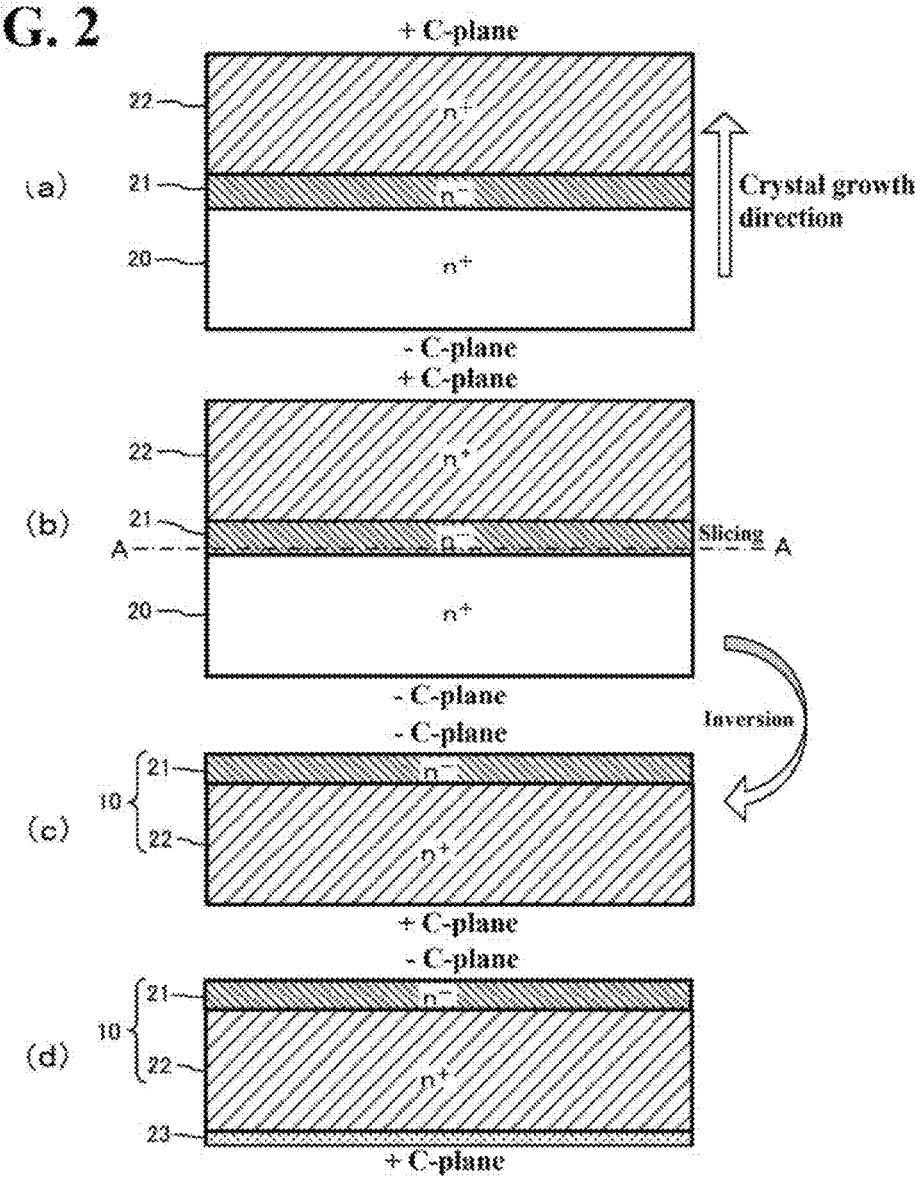
FIG. 2 is an explanation diagram (No. 1) of a specific example of a procedure of the method for manufacturing the nitride semiconductor substrate according to the present invention.

In the first layer forming step, the GaN-crystal is epitaxially grown on the +C-plane of the seed crystal substrate 20 to form the first GaN layer 21, as shown in FIG. 2(a).

Specifically, in this step, after loading of the seed crystal substrate 20 into the reaction chamber 201 is completed, the furnace port is closed and supply of H$_2$ gas or H$_2$ gas and N$_2$ gas into the reaction chamber 201 is started while heating and exhausting the inside of the reaction chamber 201. Thereafter, when the temperature and the pressure inside of the reaction chamber 201 respectively reach a desired treatment temperature and a desired treatment pressure to attain a desired atmosphere in the reaction chamber 201, the supply of HCl gas and NH$_3$ gas from the gas supply pipes 232a, 232b is started, and the GaCl gas and NH$_3$ gas are supplied to the surface of the seed crystal substrate 20. With this arrangement, the GaN-crystal is epitaxial grown on the surface of the seed crystal substrate 20 along the axis direction (hereinafter also referred to as "c-axis direction") perpendicular to the +C-plane (polar plane), that is, toward the direction of the Ga polar plane (i.e., +C-plane) to form a first GaN layer 21. Such a crystal growth toward the direction of +C-plane is preferred compared to the case of growth toward the direction of the N polar plane (i.e., −C-plane) in terms of appropriate crystal growth.

In this step, the supply of NH$_3$ gas into the reaction chamber 201 is preferably started before or at the time when the temperature of the seed crystal substrate 20 reaches 500° C., in order to prevent thermal decomposition of the GaN-crystal which forms the seed crystal substrate 20. Further, in order to enhance in-plane film thickness uniformity or the like of the first GaN layer 21, this step is preferably performed while the susceptor 208 being rotating.

In this step, as for the temperature of the zone heaters 207a, 207b, the heater 207a for heating the upstream side portion in the reaction chamber 201 surrounding the gas generator 233a is preferably set to a temperature of 700 to 900° C., for example, while the heater 207b for heating the downstream side portion in the reaction chamber 201 surrounding the susceptor 208 is preferably set to a temperature of 1000 to 1200° C., for example. Accordingly, the temperature of the susceptor 208 is regulated to a predetermined temperature from 1000 to 1200° C. In this step, the internal heater (not shown) may be used in the off state but temperature control may be performed using the internal heater so long as the temperature of the susceptor 208 is in the above-described range from 1000 to 1200° C.

Examples of other treatment conditions of this step include the followings:

Treatment pressure: 0.5 to 2 atm;
Partial pressure of GaCl gas: 0.1 to 20 kPa;
Partial pressure of $NH_3$ gas/partial pressure of GaCl gas: 1 to 100; and
Partial pressure of $H_2$ gas/partial pressure of GaCl gas: 0 to 100.

Further, when GaCl gas and $NH_3$ gas are supplied to the surface of the seed crystal substrate 20, $N_2$ gas may be added as a carrier gas from each of the gas supply pipes 232a to 232b. Since $N_2$ gas is added to regulate the blowout flow velocity of the gas supplied from the nozzles 249a to 249b, distribution of a supply amount or the like of the source gas on the surface of the seed crystal substrate 20 can be appropriately controlled, and a uniform growth rate distribution across the surface can be attained. Rare gas such as Ar gas or He gas may be added in place of $N_2$ gas.

The first GaN layer 21 formed under the above-described conditions is of $n^-$-type having a relatively lower concentration of an n-type impurity typified by Si in the GaN-crystal, specifically, having an n-type impurity concentration of less than $1\times10^{17}$ at/$cm^3$ in the GaN-crystal. The specific concentration value of the n-type impurity in the $n^-$-type first GaN layer 21 will be hereinafter explained in detail.

It is contemplated to form the first GaN layer 21 in a thickness of about 15 to 30 μm, for example.

(Second Layer Forming Step)

After the first GaN layer 21 is formed on the +C-plane of the seed crystal substrate 20, then the second layer forming step is performed. In this step, as illustrated in FIG. 2(a), the GaN-crystal is epitaxially grown on the +C-plane of the first GaN layer 21 to form the second GaN layer 22.

Specifically, in this step, Si-containing gas such as $SiH_4$ gas, $SiH_2Cl_2$ or the like is supplied as a dopant gas from the gas supply pipe 232c unlike the case of the above-described first layer forming step. The partial pressure ratio of a Si-containing gas to a group-III source gas in the reaction vessel 203 (partial pressure of a Si-containing gas/total partial pressure of GaCl gas) may be, for example, $1/1\times10^8$ to 1/1000. Other conditions are similar to those in the case of the above-described first layer forming step. With this arrangement, the GaN-crystal is epitaxial grown along the c-axis direction, that is, toward the direction of the Ga polar plane (i.e., +C-plane) on the surface of a first GaN layer 21 to form a second GaN layer 22. Such a crystal growth toward the direction of +C-plane is preferred compared to the case of growth toward the direction of the N polar plane (i.e., −C-plane) in terms of appropriate growth of the crystal.

The second GaN layer 22 formed under the above-described conditions is of $n^+$-type having a relatively higher concentration of an n-type impurity typified by Si in the GaN-crystal, specifically, having Si concentration of about $1\times10^{18}$ to $1\times10^{19}$ at/$cm^3$ in the GaN-crystal.

Such a second GaN layer 22 is contemplated to be formed to have a thickness of about 300 to 400 μm, which realizes self-standing.

The present step to form the second GaN layer 22 can be continuously performed from the first layer forming step since the present step differs from the above-described first layer forming step only in gas species.

(Unloading Step)

After the first GaN layer 21 and the second GaN layer 22 are formed on the seed crystal substrate 20, supply of HCl gas into the gas generator 233a, supply of $H_2$ gas into the reaction chamber 201, and heating with zone heaters 207a, 207b are halted while supplying $NH_3$ gas and $N_2$ gas into the reaction chamber 201 and exhausting the reaction chamber 201. When the temperature in the reaction chamber 201 is decreased to 500° C. or less, the supply of $NH_3$ gas is halted, and atmosphere in the reaction chamber 201 is replaced with $N_2$ gas and is restored to the atmospheric pressure. Then, the temperature in the reaction chamber 201 is decreased, for example, to a temperature of 200° C. or less, that is, a temperature at which the crystal ingot of the GaN (the seed crystal substrate 20 with the first GaN layer 21 and the second GaN layer 22 formed on its surface) can be unloaded from the reaction vessel 203. Thereafter, the crystal ingot is unloaded from the reaction chamber 201.

(Slicing Step)

After the crystal ingot is unloaded, as illustrated in FIG. 2(b), the crystal ingot is sliced near the interface between the seed crystal substrate 20 and the first GaN layer 21, parallel to the growth surface (see, A-A in the figure), thereby removing the seed crystal substrate 20 to expose the −C-plane of the first GaN layer 21. This slicing processing can be performed using, for example, a wire saw or an electric discharge machine. However, it is not limited to them and, for example, etching processing of the seed crystal substrate 20 may be utilized so long as the −C-plane of the first GaN layer 21 can be exposed.

After the seed crystal substrate 20 is removed, the exposed plane (−C-plane) of the first GaN layer 21 is subjected to a predetermined polishing processing to make this plane an epi-ready mirror-plane. Polishing processing can be performed, for example, by chemical machine polishing (CMP), although it is not limited thereto. Other methods may be utilized so long as it can provide an epi-ready mirror-plane.

The exposed plane (+C-plane) side of the second GaN layer 22, facing the −C-plane will be explained later.

Subsequently, after the seed crystal substrate 20 is removed and the exposed plane is subjected to the polishing processing, upside-down (vertical) inversion as illustrated in FIG. 2(c) provides the GaN substrate 10 formed of a laminate of the first GaN layer 21 and the second GaN layer 22, with the −C-plane as a main surface.

(+C-plane Side of GaN Substrate)

As for the exposed plane (+C-plane) side of the second GaN layer 22 which faces the −C-plane, it is preferred that a protective film 23 covering entire surface of the +C-plane is formed as illustrated in FIG. 2(d), considering that the GaN substrate 10 is subjected to the ion-implantation step or the like described later.

It is sufficient for the protective film 23 to be able to protect the +C-plane during the annealing or the like in the ion-implantation step described later. For example, the film formed in the thickness of 30 to 50 nm may be used. Specifically, as the protective film 23, an aluminum nitride (AlN) film which can be removed with an etching solution containing potassium borate, potassium hydroxide or the like is preferably used. However, a silicon nitride (SiN) film may also be used which can be removed with an etching solution containing hydrofluoric acid or the like.

The protective film 23 is preferably formed, for example, after removing the seed crystal substrate 20 in the slicing step and polishing the +C-plane of the second GaN layer 22, onto the resulting polished plane, although it is not necessarily limited thereto. For example, the protective film 23 may be formed subsequent to the second layer forming step in the crystal growth step, followed by the slicing step.

Moreover, the protective film 23 may be formed, for example, by utilizing a sputtering method. Specifically, in the case where an AlN film is used as the protective film 23, Al is sputtered in Ar—$N_2$ mixed gas by a RF magnetron sputtering apparatus to form a thin AlN film, although it is not limited thereto. For example, the protective film 23 may be formed using another method such as chemical vapor deposition (CVD).

The formation of the protective film 23 is not essential. The plane with the second GaN layer 22 being exposed is acceptable. In this case, the +C-plane which is the exposed plane of the second GaN layer 22 is preferably to be a mirror-plane, but it may be a lap-surface.

(2) Constitution of Nitride Semiconductor Substrate

Next, a specific example of the GaN substrate 10 obtained by the manufacturing method including the above-described procedures, that is, a specific example of the nitride semiconductor substrate according to the present invention will be explained for its constitution.

As illustrated in FIG. 2(c), the GaN substrate 10 is constituted by a laminate of a first GaN layer 21 and a second GaN layer 22, the first GaN layer 21 and the second GaN layer 22 being formed of the GaN-crystal.

(First GaN Layer)

The first GaN layer 21 constituting the GaN substrate 10 is of n⁻-type having the −C-plane as the exposed plane and having the n-type impurity concentration in the nitride semiconductor crystal of at least less than $1 \times 10^{17}$ at/$cm^3$, more preferably having the impurity concentration described later.

For details, the first GaN layer 21 is of controlled n⁻-type having the n-type impurity concentration of at least less than $1 \times 10^{17}$ at/$cm^3$, and more suitably, less than $1 \times 10^{15}$ at/$cm^3$. More specifically, each of the concentrations of Si, boron (B), and Fe contained in the crystal is less than $1 \times 10^{15}$ at/$cm^3$, and each of the concentration of oxygen (O) and carbon (C) in the crystal is less than $5 \times 10^{15}$ at/$cm^3$. All of these impurity concentrations are below a lower limit of measurement (lower limit of detection) of a currently available reasonable analytical means such as SIMS, and it is difficult to specifically present the concentration of each impurity at present.

The first GaN layer 21 contains the n-type impurity (especially Si) at the concentration described above. However, it is not preferable for it to have a semi-insulation property. It is preferred that electric resistivity is 50 Ωcm or less under temperature conditions of 20° C. or more and 200° C. or less, for example.

(Second GaN Layer)

The second GaN layer 22 constituting GaN substrate 10 is formed in the thickness which realizes self-standing in order to support the first GaN layer 21 and is of n⁺-type which ensures the conductive property.

For details, the second GaN layer 22 is similar to the first GaN layer 21 in that each of the concentrations of B and Fe in the crystal is less than $1 \times 10^{15}$ at/$cm^3$ and each of the concentrations of O and C is less than $5 \times 10^{15}$ at/$cm^3$, but different from the first GaN layer 21 in that the Si concentration is about $1 \times 10^{18}$ to $1 \times 10^{19}$ at/$cm^3$. Since the second GaN layer 22 contains Si at such a concentration, it has conductive property so that electric resistivity is $2 \times 10^{-2}$ Ωcm or less under a temperature condition of 20° C. or more and 200° C. or less, and functions as a so-called n-type semiconductor crystal.

In the second GaN layer 22, the concentration of Si and the concentration of the n-type carrier are almost the same value in the crystal. This indicates that the actual concentration of the impurity, from which a carrier is derived, other than Si (Fe or C which compensates an n-type carrier, O which serves as a donor, or the like) is extremely low, and the GaN-crystal contains such an impurity only in a negligible amount compared to the Si concentration. Although, according to the SIMS measurement, the concentrations of B, Fe, C and O are shown in the order of $10^{15}$ at/$cm^3$ or less, and the concentrations of other impurities are shown as the concentration less than a lower limit of detection, the concentrations of Si and the n-type carrier in the crystal are indicated as almost the same values, which means that the actual concentration of these impurities is in the order of $10^{14}$ at/$cm^3$ or less.

Since each of the concentrations of B, Fe, O and C in the crystal is extremely low, like the GaN crystal in the first GaN layer 21, the GaN-crystal forming such a second GaN layer 22 has a better quality compared to the conventional GaN-crystal containing larger amounts of these impurities. Moreover, since the concentration of the impurity such as Fe in the GaN-crystal is low as described above, a desired conductive property (n-type semiconductor property) may be imparted to the GaN-crystal even when an amount of Si to be added is suppressed to low. In other words, the GaN crystal of the second GaN layer 22 is more advantageous in that a desired semiconductor property may be imparted while suppressing degradation of crystal quality resulting from Si addition as much as possible compared to the conventional GaN-crystal containing a larger amount of impurity such as Fe or C. Further, the GaN-crystal of the second GaN layer 22 is more advantageous compared to the conventional GaN-crystal containing a larger amount of impurity because of the extremely low concentration of impurities which may cause a carrier scattering, and thus can avoid reduced mobility of the carrier.

(Entire Constitution)

The GaN substrate 10 constituted by the laminate including the first GaN layer 21 and the second GaN layer 22 as described above has the −C-plane (N polar plane) as an exposed plane and constituted such that the impurity concentration of the first GaN layer 21 having the exposed plane becomes extremely low. More specifically, the GaN substrate 10 has a bi-layer structure of a laminate of the n⁻-type first GaN layer 21 having the −C-plane as an exposed plane and the n+-type second GaN layer 22 having the +C-plane as an exposed plane, in which at least the −C-plane that is an exposed plane of the first GaN layer 21 is finished to be a mirror-polished plane (an epi-ready mirror-plane).

Moreover, the bi-layer structure GaN substrate 10 may be the one in which each of the first GaN layer 21 and the second GaN layer 22 constituting the bi-layer structure is subjected to beveling (chamfering process) at their respective corner portions to avoid chipping (cracking) thereof. Furthermore, the bi-layer structure GaN substrate 10 may also be the one provided with a linear portion called orientation flat or a cut-out portion called a notch on the periphery of the substrate in order to define the substrate orientation.

Moreover, the bi-layer structure GaN substrate 10 is suitably used for manufacturing a semiconductor device such as a laser diode, an LED, and a high speed transistor, and preferably has a diameter D of 25 mm or more since the substrate having a diameter D of less than 25 mm tends to result in reduced productivity of the semiconductor device. Preferably the substrate has a thickness T of 250 µm or more, since the GaN substrate 10 having a thickness T of less than 250 µm has a low mechanical strength and is more susceptible to cracking of the substrate in a device structure using the substrate during crystal growth or subsequent device processing, thus making it difficult to maintain a freestanding state. The dimensions described herein is just an example, and this embodiment is not limited thereto.

(3) Ion-Implantation of P-Type Impurity

Next, the case where the p-type impurity is implanted by ion-implantation into the GaN substrate 10 of the above-described constitution will be specifically explained.

For example, when the p-type impurity such as Mg is implanted by ion-implantation into the GaN substrate 10 to form a p-type region in the GaN substrate 10, the ion-implantation step and the annealing step will be performed.

(Ion-Implantation Step)

Figure 3:
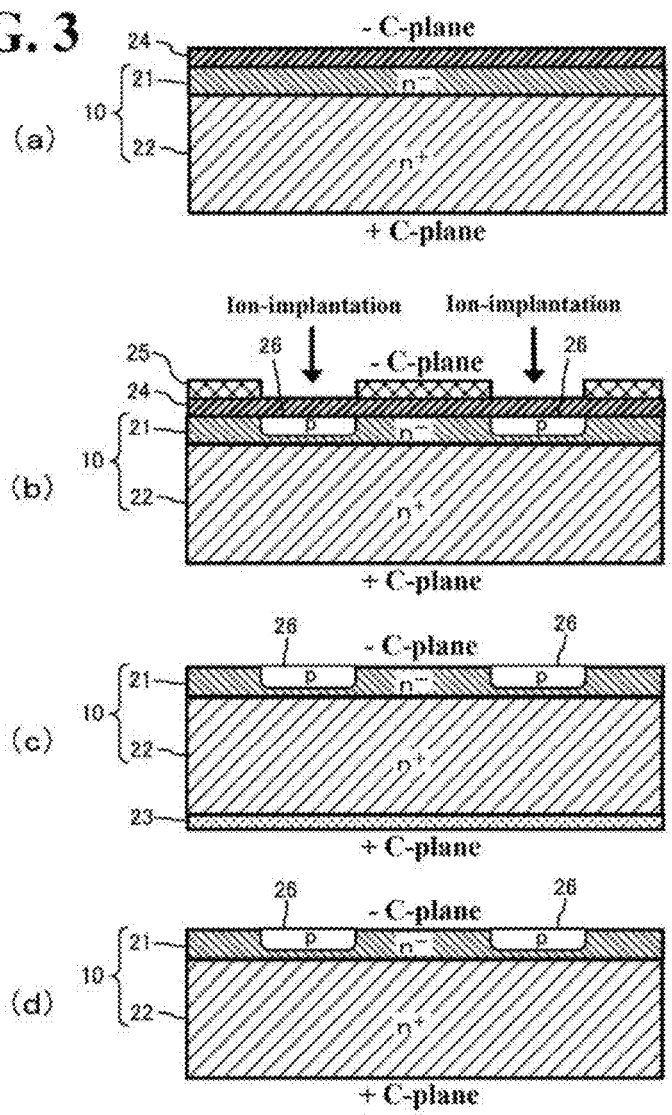
FIG. 3 is an explanation diagram (No. 2) of the specific example of the procedure of the method for manufacturing the nitride semiconductor substrate according to the present invention.

In this step, for example, a silicon nitride (SiNx) film 24 which functions as a protective film is firstly formed in the thickness of 30 to 50 nm on the −C-plane (N polar plane) of the first GaN layer 21 which is the main surface of the GaN substrate 10, as illustrated in FIG. 3(a). In forming the SiNx film 24, the method therefor is not particularly limited and a known method such as reactive sputtering method may be used.

After the SiNx film 24 is formed, a resist pattern 25 which has been subjected to a desired patterning is also formed on the SiNx film 24 as illustrated in FIG. 3(b). A resist material constituting the resist pattern 25, a formation method thereof, a patterning method and the like are not particularly limited and may be acceptable so long as they utilize a known technology.

After the resist pattern 25 is formed, the p-type impurity is ion-implanted into the −C-plane (N polar plane) of the first GaN layer 21 which is the main surface of the GaN substrate 10. In other words, the −C-plane of the first GaN layer 21 constituting the GaN substrate 10 is used as a plane into which the p-type impurity is ion-implanted and has on the surface thereof a portion into which the p-type impurity is implanted. The ion-implantation can be performed by the known method using an ion-implantation apparatus.

Using this ion-implantation, a p-type region 26 is formed in the first GaN layer 21. Thereafter, as illustrated in FIG. 3(c), the SiNx film 24 and the resist pattern 25 are removed with an etching solution containing hydrofluoric acid (HF) or buffered hydrofluoric acid (BHF). Moreover, on the exposed plane (+C-plane) of the second GaN layer 22 which faces the −C-plane of the GaN substrate 10, for example, a protective film 23 constituted by the AlN film is formed in the thickness of 30 to 50 nm by utilizing a sputtering method.

(Annealing Step)

In this step, an annealing is performed in order to neatly arrange the crystal lattice of the GaN-crystal after the ion-implantation step. The annealing is performed in the high temperature region, for example, at 1200° C. or more, specifically at the temperature about 1250° C. for a period of about 3 minutes.

Even when the annealing is performed in such a high temperature region, the thermal decomposition of the GaN-crystal may be prevented from becoming problematic since the −C-plane into which ion has been implanted is thermally stable. Further, since a protective film 23 is formed on the +C-plane which faces the −C-plane, a problem of an adverse effect of heat such as roughened surface can be avoided even when the annealing is performed in the high temperature region.

After the annealing, an etching processing is performed, for example, using AZ400K developing solution which is a potassium borate solution to remove the protective film 23, as illustrated in FIG. 3(d).

After the step described above, the GaN substrate 10 with a p-type region 26 formed in the first GaN layer 21 can be obtained. In the p-type region 26, the concentration of the impurity such as Mg is $3 \times 10^{18}$ at/cm$^3$ or more. Since the p-type region 26 contains the p-type impurity at the concentration, it has a conductive property so that electric resistivity is less than $1 \times 10^2$ Ωcm under a temperature condition of 20° C. or more and 200° C. or less, and thus functions as a so-called p-type semiconductor crystal. The Mg concentration may be, for example, $3 \times 10^{18}$ at/cm$^3$ or more and $5 \times 10^{20}$ at/cm$^3$ or less. In this case, the concentration of the p-type carrier is, for example, $2 \times 10^{17}$/cm$^3$ or more and $5 \times 10^{18}$/cm$^3$ or less under a temperature condition of 20° C. or more and 200° C. or less, the electric resistivity is 0.5 Ωcm or more and 100 Ωcm or less under the same temperature conditions.

The GaN-crystal of the first GaN layer 21 into which the ion-implantation is performed in this step has a better quality compared to the conventional GaN-crystal containing larger amounts of these impurities since each of the concentrations of Si, B, Fe, O and C in the crystal is extremely low. In addition, since the concentration of the impurity such as Si or O in the GaN-crystal is extremely low, a desired conductive property (p-type semiconductor property) can be imparted to the GaN-crystal in this step even when an amount of the p-type impurity such as Mg to be implanted is suppressed to low. In other words, the GaN-crystal of the first GaN layer 21 is more advantageous compared to the conventional GaN-crystal containing a larger amount of impurity such as Si or O in that a desired semiconductor property can be imparted while suppressing reduction in crystal quality due to the implantation of impurity such as Mg as much as possible. Further, the extremely low concentration of the impurity which causes a carrier scattering is more advantageous in that reduction in a carrier mobility can be avoided compared to the case where a larger amount of impurity is contained.

(4) Constitution of Semiconductor Device

The GaN substrate 10 in which the p-type region 26 is formed in the above-described ion-implantation step is preferably used for constitution of a semiconductor device.

Figure 4:
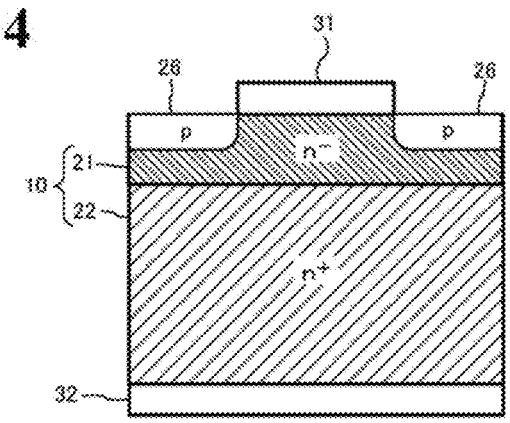
FIG. 4 is a schematic block diagram of a specific example of a semiconductor device constituted using the nitride semiconductor substrate according to the present invention.

Specifically, as illustrated in FIG. 4, since a p-type region 26 is formed in the first GaN layer 21 by ion-implantation of the p-type impurity into the −C-plane of the first GaN layer 21 of the GaN substrate 10 and the p-type region 26 is in turn used to constitute a pn-junction to form an upper electrode 31 and an lower electrode 32, this laminate structure can function as an pn-junction diode. Alternatively, since a laminate structure including a junction-plane (Schottky barrier junction-plane) between either of the p- and n-type regions described above and a metal layer containing metal is fabricated, this laminate structure may be made to function as a Schottky barrier diode (JBS). Still alternatively, it can be made to function, for example, as a metal semiconductor field-effect transistor (MESFET), a gate injection transistor (GIT), a −C-plane high-electron-mobility transistor (HEMT) or the like.

(5) Effect Obtained According to this Embodiment

According to this embodiment, one or more effects shown below may be obtained.

(a) In this embodiment, the GaN-crystal is grown on the +C-plane of the seed crystal substrate 20 to form the n⁻-type first GaN layer 21, and the GaN-crystal is further grown on the +C-plane of the first GaN layer 21 to form the second GaN layer 22, and subsequently the seed crystal substrate 20 is removed to expose the −C-plane of the first GaN layer 21, thereby obtaining as the GaN substrate 10 a laminate of the first GaN layer 21 and the second GaN layer 22, with the −C-plane as a main surface. Accordingly, this embodiment is preferred in terms of appropriate growth of the crystal compared to the case where the GaN crystal is grown in the direction of N polar plane (i.e., −C-plane), since the GaN crystal shall be grown in the direction toward the Ga polar plane (i.e., +C-plane) for both of the first GaN layer 21 and the second GaN layer 22. Furthermore, unlike the case to grow in the direction toward the N-polar plane (i.e., −C-plane), since the incorporation of impurities such as O does not become significant in the growth process, the impurity concentration can be suppressed to extremely low. In other words, unlike the conventional general manufacturing method, this embodiment can appropriately provide the GaN substrate 10 constituted to have as an exposed plane a N polar plane (−C-plane) into which the ion-implantation can be performed, and to have an extremely low impurity concentration in the GaN-crystal into which the ion-implantation is to be performed.

(b) In this embodiment, the n-type impurity concentration in the GaN-crystal is less than $1 \times 10^{17}$ at/cm$^3$ in the first GaN layer 21 having the −C-plane as an exposed plane. As described above, since the GaN-crystal in the first GaN layer 21 has a low impurity concentration and high-purity, the amount of ion to be implanted can be suppressed to low when Mg ion is implanted into the crystal by ion-implantation to make this crystal a p-type semiconductor, for example. In other words, the GaN-crystal in the first GaN layer 21 is more advantageous compared to the conventional GaN-crystal which contains a larger amount of impurity such as Fe, in that a desired semiconductor property can be imparted while suppressing reduction in the crystal quality due to the ion-implantation as much as possible. Further, the GaN-crystal in the first GaN layer 21 is also more advantageous in that reduction in mobility of the carrier can be avoided because of the extremely low concentration of impurity which may cause a carrier scattering compared to the conventional GaN-crystal containing a larger amount of impurity.

(c) In particular, each concentration of Si, B and Fe in the GaN-crystal obtained in this embodiment is as extremely small as less than $1 \times 10^{15}$ at/cm$^3$, and each concentration of O and C is as extremely small as less than $5 \times 10^{15}$ at/cm$^3$. The concentrations of these impurities are not actually measured concentrations of the respective impurities but indicate the current lower limit of detection in SIMS measurement which is a representative technique of analyzing impurities. In other words, it means that the actual concentrations of the respective impurities were able to be reduced to such a low value that cannot be detected according to the current technique.

As described above, the GaN-crystal obtained according to this embodiment has extremely excellent crystal quality, for example, greatly reduced defect density, dislocation density, and internal stress compared to the conventional GaN-crystal which contain larger amounts of these impurities. Further, when the GaN substrate 10 constituted to have such a GaN crystal is used to fabricate a semiconductor device, diffusion of the impurities may be suppressed compared to a case of using a substrate formed of the aforementioned GaN-crystal which contains a larger amount of impurity, and, due to such an effect, enhanced property and prolonged service life of the device can be obtained.

(d) In this embodiment, each of the first GaN layer 21 and the second GaN layer 22 which constitute the GaN substrate 10 is formed by the HVPE method. According to this embodiment, therefore, even when the GaN substrate 10 is composed of a laminate of the first GaN layer 21 and the second GaN layer 22, the first GaN layer 21 and the second GaN layer 22 can be continuously formed, which is extremely preferable to enhance the productivity in the production of the GaN substrate 10. Furthermore, since the HVPE method is used, this embodiment is extremely preferable for forming the second GaN layer 22 in a thickness which realizes self-standing.

(e) In this embodiment, the p-type impurity is ion-implanted into the −C-plane (N polar plane) of the first GaN layer 21, which is the main surface of the GaN substrate 10, to form the p-type region 26 in the first GaN layer 21, the p-type region functioning as the p-type semiconductor crystal. Accordingly, since the ion-implantation is performed into the thermally stable −C-plane (N polar plane) of the first GaN layer 21, the thermal decomposition of the GaN-crystal can be prevented from becoming problematic even when an annealing in the high temperature region at 1200° C. or more is required to neatly arrange the crystal lattice of the GaN-crystal after the ion-implantation. Furthermore, since the concentration of the impurity such as Si or O in the GaN-crystal of the first GaN layer 21 into which the ion-implantation is performed is extremely low, a desired conductive property (p-type semiconductor property) can be imparted to the GaN-crystal even when an amount of the p-type impurity such as Mg to be implanted is suppressed to low. In other words, the GaN-crystal is more advantageous compared to the conventional GaN-crystal containing a larger amount of impurity such as Si or O in that a desired semiconductor property can be imparted while suppressing reduction in crystal quality due to the implantation of impurity such as Mg as much as possible. Further, the extremely low concentration of the impurity which causes a carrier scattering is more advantageous in that reduction in a carrier mobility can be avoided compared to the case where a larger amount of impurity is contained.

Second Embodiment of the Present Invention

Next, a second embodiment of the present invention will be explained with reference to drawings. Here, the difference from the first embodiment will be mainly explained and the content similar to that of the first embodiment will be omitted.

In this embodiment, the crystal growth step is different from that in the first embodiment described above. In the crystal growth step in this embodiment, after the seed crystal substrate 20 is placed on the susceptor 208 of the HVPE apparatus 200, a first layer forming step of forming the first GaN layer 21 and a second layer forming step of forming the second GaN layer 22 are repeated for a plural times. At this time, in the first layer forming step, the first GaN layer 21 is formed, for example, to have a thickness of about 15 to 30 μm similarly in the first embodiment. On the other hand, in the second layer forming step, unlike the first embodiment, the second GaN layer 22 is formed, for example, to have a thickness of about 600 to 750 µm considering the machining margin in the slicing step described later.

Figure 5:
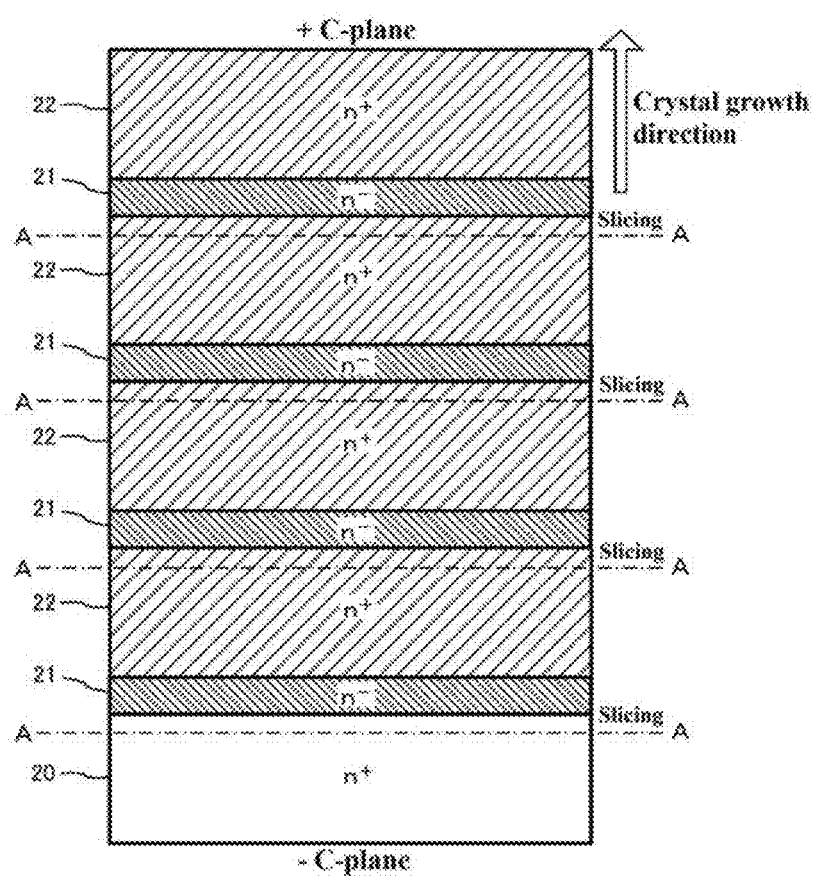
FIG. 5 is an explanation diagram of another specific example of the method for manufacturing the nitride semiconductor substrate according to the present invention.

Accordingly, a crystal ingot is obtained which has a laminate structure including the first GaN layer 21 and the second GaN layer 22 alternately laminated each other on the seed crystal substrate 20, as illustrated in FIG. 5.

Subsequently, after the crystal ingot is unloaded from the reaction chamber 201, the slicing step is performed to the crystal ingot to slice it in such a way that the laminate structure is divided (see, A-A in the figure). At this time, the position of slicing processing is a portion at which the second GaN layer 22 is formed in order to avoid variation in thickness of the first GaN layer 21. More specifically, after the slicing processing, the remaining portion of one of the second GaN layers 22 is to be subjected to polishing processing to expose the −C-plane of the first GaN layer 21. For example, the position of the second GaN layer 22 to be subjected to the slicing processing is set so that its remaining portion has a thickness of about 30 to 50 µm which corresponds to a polishing margin during the polishing processing. With such a setting for the slicing processing, since the thickness of the second GaN layer 22 is about 600 to 750 µm, the remaining portion of the second GaN layer 22 has a thickness of about 300 to 400 µm which realizes self-standing, assuming that the remaining portion of one of the above-described second GaN layers 22 is about 30 to 50 µm, the machining margin for a wire saw or electric discharge machining is about 200 to 250 µm, and polishing margin for an exposed plane (+C-plane) of the other remaining portion of the second GaN layer 22 is about 30 to 50 µm.

The slicing processing may be performed at a plural positions, for example without limitation, in a simultaneous parallel fashion using a multiwire saw or individually for each point to be processed.

Since the above-described slicing step is performed, a plurality of GaN substrates 10 are obtained from a crystal ingot having a laminate structure of the first GaN layer 21 and the second GaN layer 22. Each of thus obtained GaN substrates 10 has the constitution similar to that in the first embodiment described above.

In the case of forming a protective film 23 for protecting each of the +C-plane of the GaN substrate 10, a slicing step is performed and a protective film 23 may be formed individually for each of the resulting GaN substrate 10, or the first layer forming step and the second layer forming step are repeated with a step of forming a protective film 23 intervening therebetween.

According to this embodiment, the effect explained below can be obtained in addition to the effect explained in the first embodiment.

Namely, according to this embodiment, since a plurality of GaN substrates 10 are obtained from a laminate structure of the first GaN layer 21 and the second GaN layer 22, the production of the GaN substrate 10 can be efficiently performed which is extremely suitable for mass production of the GaN substrate 10.

Third Embodiment of the Present Invention

Next, a third embodiment of the present invention will be explained with reference to drawings. Here, the difference between the first embodiment and the second embodiment described above will be mainly explained.

(Crystal Growth Step)

In this embodiment, the first embodiment and the second embodiment described above are different from each other in their crystal growth step. Also, in this embodiment, the crystal growth step includes the first layer forming step which is performed using the HVPE apparatus 200 and the second layer forming step, similar to the first and second embodiments.

(First Layer Forming Step)

Figure 6:
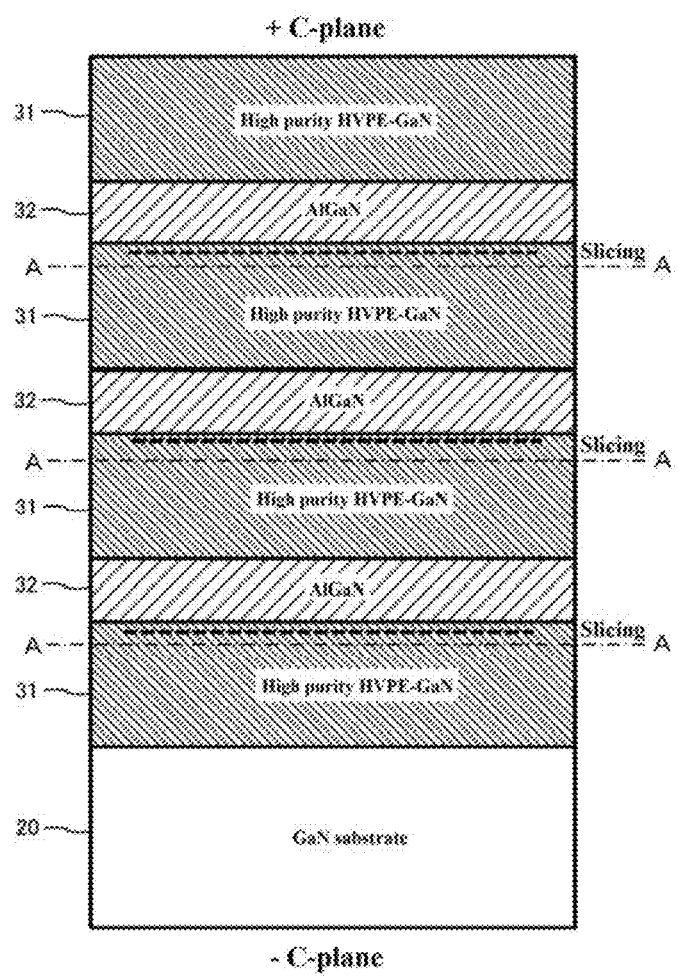
FIG. 6 is an explanation diagram (No. 1) of a still another specific example of the method for manufacturing the nitride semiconductor substrate according to the present invention.

In the first layer forming step, as described in FIG. 6, a high-purity HVPE-GaN layer (hereinafter simply referred to as a "GaN layer") 31 which is an example of the n⁻-type first nitride semiconductor layer is firstly formed on the +C-plane of the seed crystal substrate (GaN substrate) 20 placed on the susceptor 208 of the HVPE apparatus 200. This GaN layer 31 is similar to the first GaN layer 21 explained in the first and second embodiments and has the n-type impurity concentration in the GaN-crystal of less than $1 \times 10^{17}$ at/cm³.

However, the GaN layer 31 in this embodiment is contemplated to be formed, for example, in the thickness of 600 to 750 µm, preferably about 500 µm, unlike the first GaN layer 21 of the first embodiment or the like.

Further, the GaN layer 31 in this embodiment is constituted as a semi-insulating layer having a relatively higher insulation property, that is, a relatively larger electric resistivity, unlike the first GaN layer 21 in the first embodiment or the like, since it is used as a buffer layer, for example, when the HEMT is constituted as described later. As the electric resistivity of the GaN-crystal constituting the GaN layer 31, magnitude of $1 \times 10^6$ Ωcm or more is maintained, for example, under a temperature condition of 20° C. or more and 200° C. or less, and magnitude of $1 \times 10^5$ Ωcm or more is maintained under a temperature condition of exceeding 200° C. and 400° C. or less. For example, magnitude of about $1 \times 10^9$ Ωcm is shown as the upper limit of the electric resistivity of the GaN-crystal, although it is not particularly limited. Such a high electric resistivity of the GaN-crystal in this embodiment is attributable to extremely low concentrations of various impurities contained in the crystal.

As described above, the GaN-crystal in the GaN layer 31 possesses high insulation property such that electric resistivity is $1 \times 10^6$ Ωcm or more under a temperature condition of 20° C. or more and 200° C. or less. When the GaN-crystal contains a large amount of a donor impurity such as Si or O, there is known a method, as disclosed in Japanese Unexamined Patent Application Publication No. 2007-534580, of adding into the crystal a donor-compensating impurity (hereinafter referred to as a compensating impurity) such as Mn, Fe, cobalt (Co), Ni, copper (Cu) in order to improve the insulation property of the crystal. However, this method is disadvantageously accompanied by a problem in that, upon addition of the compensating impurity, the quality of the GaN-crystal is more likely to be reduced. For example, when the compensating impurity is added into the GaN-crystal, a crack is likely to occur in a substrate obtained by slicing the crystal. Further, when the compensating impurity is diffused into the laminated structure formed on the substrate, the characteristic of the semiconductor device fabricated using this substrate is more likely to be degraded. In contrast, the GaN-crystal according to this embodiment provides high insulation property without adding the compensating impurity, and as a result, a problem of degraded crystallinity can be avoided, which is frequently problematic in the conventional method.

Moreover, the insulation property of the GaN-crystal in the GaN layer 31 is less temperature dependent and more stable compared to the insulation property obtained by adding an impurity for compensating into the crystal. Indeed, it seems that an insulation property similar to that of the GaN-crystal according to this embodiment can be imparted upon addition of Fe to a GaN-crystal containing Si or O at the concentration of, for example, $1 \times 10^{17}$ at/cm$^3$ or more, the concentration of Fe exceeding the concentration of Si or O. However, the level of Fe which is used as a compensating impurity is as relatively low as about 0.6 eV. Therefore, the insulation property obtained upon addition of Fe may be characteristically more easily reduced with increase of temperature, compared to the insulation property of the GaN-crystal according to this embodiment. On the contrary, according to this embodiment, the insulation property can be attained without adding the compensating impurity. Accordingly, the problem of increased temperature dependence can be avoided, which is frequently problematic in the conventional method.

(Second Layer Forming Step)

After the GaN layer 31 is formed on the +C-plane of the GaN substrate 20, then the second layer forming step is performed. In this step, aluminum gallium nitride (AlGaN) crystal is epitaxially grown on the +C-plane of the GaN layer 31, to form an AlGaN layer 32 which is an exemplary second nitride semiconductor layer.

In the case of using the HVPE apparatus 200, formation of the AlGaN layer 32 can be performed as follows. Specifically, a Ga-source supply system for supplying GaCl gas produced from a reaction between HCl gas and a Ga melt as well as an Al-source supply system for supplying aluminum chloride (AlCl$_3$) gas produced from a reaction between solid aluminum (Al) and HCl gas as raw materials are prepared in the HVPE apparatus 200. Thereafter, GaCl gas, AlCl$_3$ gas, and NH$_3$ gas as film-forming gases are supplied onto the +C-plane of the GaN layer 31. These film-forming gases may be mixed and supplied with a carrier gas composed of H$_2$ gas, N$_2$ gas, or a mixed gas thereof. Accordingly, AlGaN crystal is epitaxially grown by vapor phase epitaxy on the +C-plane of the GaN layer 31, thereby forming the AlGaN layer 32.

Examples of the treatment conditions of this step include the followings:

Partial pressure of AlCl$_3$ gas: 0.01 to 1 kPa;

Partial pressure of NH$_3$ gas/Partial pressure of AlCl$_3$ gas: 1 to 100; and

Partial pressure of H$_2$ gas/Partial pressure of AlCl$_3$ gas: 0 to 100.

Other conditions are the same as those in the above-described first embodiment.

The AlGaN layer 32 in this embodiment is contemplated to form in a thickness of, for example, 50 to 100 nm, and preferably about 20 nm.

(Repetition of Steps)

Thereafter, the first layer forming step of forming the GaN layer 31 and the second layer forming step of forming the AlGaN layer 32 are respectively repeated for a plurality of times. Accordingly, a crystal ingot is obtained which has a laminate structure including the GaN layer 31 and the AlGaN layer 32 alternatively laminated each other on the GaN substrate 20. Note that a portion indicated by a broken line in the figure represents a region in which the two-dimensional electron gas (2DEG) distributes in the GaN layer 31 when the semiconductor device is constituted as described later.

(Slicing Step)

After that, the slicing step is performed to the crystal ingot having a laminate structure of the GaN layer 31 and the AlGaN layer 32 to slice it in such a way that the laminate structure is divided (see, A-A in the figure). In this case, a position to be subjected to the slicing processing is a portion at which the GaN layer 31 is formed. For example, it is set so that the remaining GaN layer 31 of the side containing 2DEG distribution region after the slicing processing has a thickness of about 50 to 100 μm.

Figure 7:
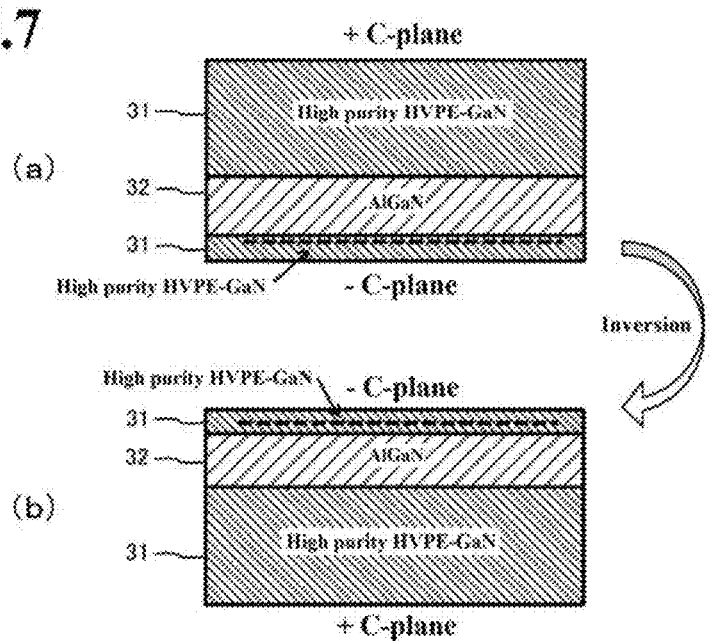
FIG. 7 is an explanation diagram (No. 2) of the still another specific example of the method for manufacturing the nitride semiconductor substrate according to the present invention.

Therefore, several laminated substrates including a 2DEG distribution region and having a thickness of about 50 μm are obtained from the crystal ingot after the slicing processing, in which the one remaining portion of the GaN layer 31, the AlGaN layer 32, and the other remaining portion of the GaN layer 31 are laminated in this order as illustrated in FIG. 7(a).

The upside-down (vertical) inversion of thus obtained laminated substrate gives a laminated substrate (a nitride semiconductor substrate), as illustrated in FIG. 7(b), formed of a laminate of the GaN layer 31 and the AlGaN layer 32, with the −C-plane as a main surface, which is constituted such that the n-type impurity concentration in the GaN layer 31 is less than $1 \times 10^1$ at/cm$^3$. In this case, the −C-plane which is the exposed plane of the GaN layer 31 is processed to a mirror-polished plane before use as described later.

(Constitution of Semiconductor Device)

Now, the semiconductor device constituted using the laminated substrate of the GaN layer 31 and the AlGaN layer 32 obtained in this embodiment will be explained. Here, the case of constituting the HEMT is mentioned as a specific example of the semiconductor device.

Figure 8:
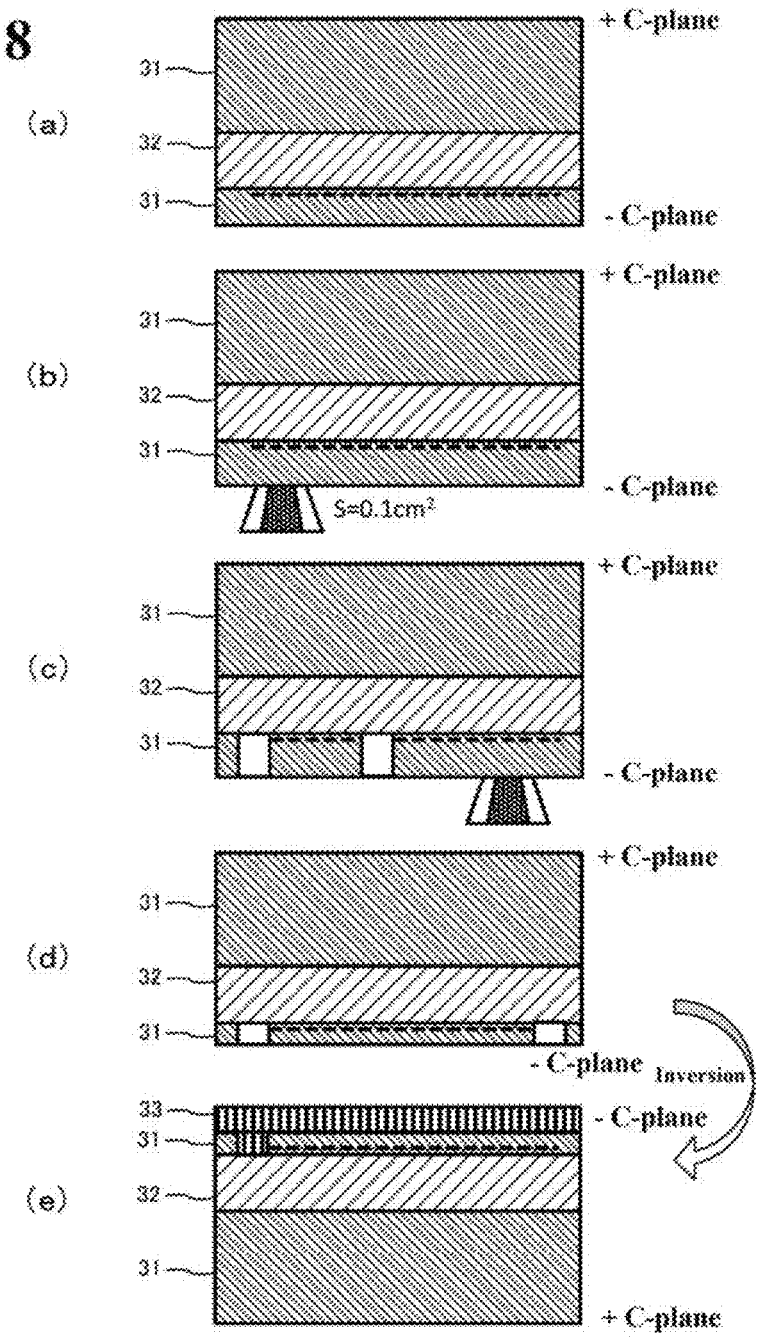
FIG. 8 is an explanation diagram (No. 1) of a specific example of the method for manufacturing the semiconductor device constituted using the nitride semiconductor substrate according to the present invention.

In constituting the HEMT, a laminate, which includes a remaining portion of a GaN layer 31 having a thickness of about 50 to 100 μm so as to include 2DEG distribution region, an AlGaN layer 32, and the other remaining portion of the GaN layer 31, sequentially laminated in this order as illustrated in FIG. 8(a) is firstly prepared after the slicing step (including a preliminary polishing processing).

After the laminated substrate is prepared, the remaining portion of the GaN layer 31 prepared to have a thickness of about 50 to 100 μm is subjected to an electrochemical etching (ECV) measurement from the side of the −C-plane which is its exposed plane to perform a film thickness measurement, as illustrated in FIG. 8(b). The film thickness measurement utilizing the ECV measurement can be performed, for example, by contacting an electrolyte solution with an area of about S=0.1 cm$^2$ using an automated carrier concentration measuring apparatus (manufactured by Nanometrics Japan) and performing the C-V measurement using an electrochemical junction (Mott shottoky junction) to obtain a carrier concentration distribution profile in the depth direction. Such a measurement is performed on several arbitrary points in the −C-plane as illustrated in FIG. 8(c). In this case, the GaN layer 31 may be provided with a trench for monitoring the film thickness.

After film thickness measurement, a polishing processing is performed for the remaining portion of the GaN layer 31 to reduce its film thickness as illustrated in FIG. 8(d). In this case, the polishing processing is performed while controlling a polishing rate, a polishing time and the like so that the remaining film thickness after the polishing processing is, for example, about 5 μm based on the measurement result of the film thickness. The polishing processing can be performed by CMP which is easy to control the polishing rate, the polishing time and the like, but is not limited thereto. Other method may be utilized so long as it can control the remaining film thickness.

After the polishing processing is performed so that the film thickness of the remaining portion on the −C-plane side of the GaN layer 31 is about 5 μm, it is inverted upside-down (vertically) as illustrated in FIG. 8(e). Thereafter, for example, plasma CVD using tetraethoxysilane (TEOS) raw material is used to form a SiO$_2$ film 33 over the entire surface of the −C-plane.

Figure 9:
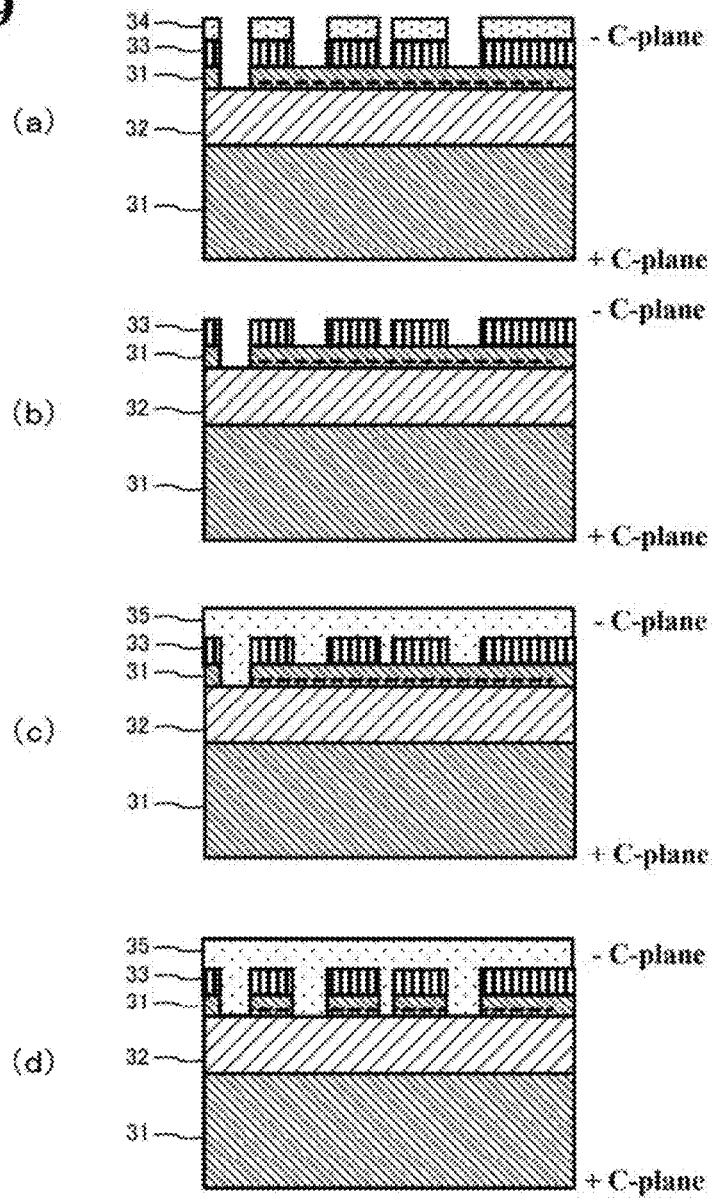
FIG. 9 is an explanation diagram (No. 2) of the specific example of the method for manufacturing the semiconductor device constituted using the nitride semiconductor substrate according to the present invention.

After that, as illustrated in FIG. 9(a), a known photolithography technology is utilized to form a resist pattern 34 on the SiO$_2$ film 33, and then BHF etching processing is performed using the resist pattern 34 as a mask. Then, the resist pattern 34 is removed after the BHF etching to obtain a SiO$_2$ film 33 patterned corresponding to the resist pattern 34 as illustrated in FIG. 9(b). The patterned and incised portions after removal respectively correspond to a source portion, a gate portion, and a drain portion as described later.

After the SiO$_2$ film 33 is patterned, then an electrolyte solution 35 is supplied from the −C-plane side as illustrated in FIG. 9(c) to perform electrochemical etching processing (ECV etching). Accordingly, a portion of the GaN layer 31 (specifically, a portion which is not covered with the SiO$_2$ film 33) is removed as illustrated in FIG. 9(d). However, the AlGaN layer 32 is not removed but serves as an etching stopper.

In this case, the portions of the GaN layer 31 respectively corresponding to the source portion, the gate portion, and the drain portion are etched to about 20 to 30 nm, and preferably about 10 nm thick while monitoring the ECV profile (omitted in FIG. 9(d)).

Figure 10:
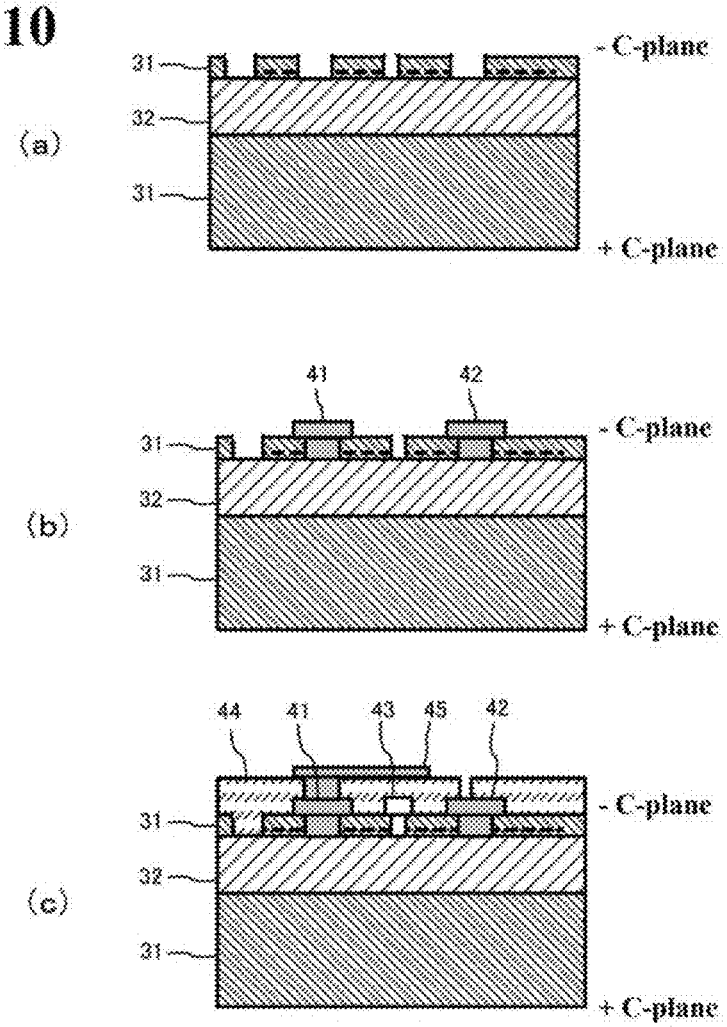
FIG. 10 is an explanation diagram (No. 3) of the specific example of the method for manufacturing the semiconductor device constituted using the nitride semiconductor substrate according to the present invention.

Thereafter, the SiO$_2$ film 33 is completely removed by a BHF etching processing to obtain the GaN layer 31, which has the −C-plane as an exposed plane as illustrated in FIG. 10(a), is formed so that the thickness of the remaining portion containing the 2DEG distribution region is about 5 μm, for example, and is patterned respectively corresponding to the source, gate, drain portions described later.

After that, as illustrated in FIG. 10(b), for example, a source electrode 41 which is composed of a titanium (Ti)/ aluminum (Al) film and a drain electrode 42 which is also composed of the Ti/Al film is formed on the patterned GaN layer 31. Subsequently, in order to obtain an ohmic junction, for example, heat treatment is performed in a N$_2$ gas atmosphere at 550° C. for 10 minutes. Then, as illustrated in FIG. 10(c), for example, a gate electrode 43 containing nickel (Ni)/gold (Au) film is formed, and further a field plate 45 containing a Ti/Al film is formed via an insulating film 44 containing SiNx film.

Accordingly, HEMT having a field plate (FP) structure which is excellent in withstand voltage can be constituted.
(Effect According to this Embodiment)

In the above-described embodiments of the present invention, one or more effects explained in the first embodiment or the second embodiment can be obtained.

Other Embodiments of the Present Invention

Hereinbefore, the first embodiment, the second embodiment, and the third embodiment of the present invention have been specifically explained. However, the present invention is not construed to be limited to the above-described embodiments, and various changes may be made without departing from the gist of the invention.

(a) In the above-described embodiments, the case where the nitride semiconductor crystal is the GaN crystal is mainly explained by way of an example. In this regard, the present invention can be suitably applied to growth of not only GaN, but also, for example, group-III nitride semiconductor crystal such as aluminum nitride (AlN), aluminum gallium nitride (AlGaN), indium nitride (InN), indium gallium nitride (InGaN), or aluminum indium gallium nitride (AlInGaN), that is, crystal represented by the composition formula of In$_x$Al$_y$Ga$_{1-x-y}$N (satisfying 0≤x≤1, 0≤y≤1, 0≤x+y≤1).

(b) The crystal growth step of the present invention is not limited to the methods illustrated in the above-described embodiments, and other methods may be used in combination as long as the impurity concentration in the crystal can be more reliably reduced.

Preferred Aspect of the Present Invention

Hereinafter, supplementary descriptions of the preferred aspects of the present invention will be given.
(Supplementary Description 1)

According to an aspect of the present invention,
there is provided a method for manufacturing a nitride semiconductor substrate including:
growing nitride semiconductor crystal along a c-axis direction on a +C-plane of a seed crystal substrate formed of nitride semiconductor crystal to form an n$^-$-type first nitride semiconductor layer;
growing the nitride semiconductor crystal along the c-axis direction on the +C-plane of the first nitride semiconductor layer to form a second nitride semiconductor layer; and
removing the seed crystal substrate and exposing a −C-plane of the first nitride semiconductor layer to obtain as a semiconductor substrate a laminate of the first nitride semiconductor layer and the second nitride semiconductor layer, with the −C plane as a main surface.
(Supplementary Description 2)

There is provided the method according to supplementary description 1,
wherein preferably, in the first nitride semiconductor layer, an n-type impurity concentration in the nitride semiconductor crystal is less than 1×10$^{17}$ at/cm$^3$.
(Supplementary Description 3)

There is provided the method according to supplementary description 2,
wherein preferably, in the first nitride semiconductor layer, each concentration of Si, B, and Fe in the nitride semiconductor crystal is less than 1×10$^{15}$ at/cm$^3$, and each concentration of O and C in the nitride semiconductor crystal is less than 5×10$^{15}$ at/cm$^3$.
(Supplementary Description 4)

There is provided the method according to any one of the supplementary descriptions 1 to 3,
wherein preferably at least each of the first nitride semiconductor layer and the second nitride semiconductor layer is formed by a hydride vapor phase epitaxy method.
(Supplementary Description 5)

There is provided the method according to any one of the supplementary descriptions 1 to 4, preferably including:
ion-implanting a p-type impurity into the −C-plane which is the main surface of the nitride semiconductor substrate; and
annealing the nitride semiconductor substrate after ion-implanting.
(Supplementary Description 6)

There is provided the method according to supplementary description 5,
wherein preferably the annealing is performed in a high temperature region at 1200° C. or more.
(Supplementary Description 7)

There is provided the method according to any one of the supplementary descriptions 1 to 6,
wherein preferably formation of the first nitride semiconductor layer and formation of the second nitride semiconductor layer are repeatedly performed to obtain a laminate structure in which the first nitride semiconductor layer and the second nitride semiconductor layer are alternately laminated and further to obtain a plurality of the nitride semiconductor substrates from the laminate structure.

(Supplementary Description 8)

According to another aspect of the present invention, there is provided a nitride semiconductor substrate constituted by a laminate of a first nitride semiconductor layer formed of nitride semiconductor crystal and a second nitride semiconductor layer formed of nitride semiconductor crystal, wherein the first nitride semiconductor layer is of $n^-$-type having a −C-plane as an exposed plane, and an n-type impurity concentration in the nitride semiconductor crystal is less than $1\times10^{17}$ at/cm$^3$.

(Supplementary Description 9)

There is provided the substrate according to supplementary description 8, wherein preferably, in the first nitride semiconductor layer, each concentration of Si, B, and Fe in the nitride semiconductor crystal is less than $1\times10^{15}$ at/cm$^3$, and each concentration of O and C in the nitride semiconductor crystal is less than $5\times10^{15}$ at/cm$^3$.

(Supplementary Description 10)

There is provided the substrate according to supplementary description 8 or 9, wherein preferably, in the first nitride semiconductor layer, a concentration of the n-type carrier is $1\times10^{16}$/cm$^3$ under the temperature condition of 20° C. or more and 200° C. or less.

(Supplementary Description 11)

There is provided the substrate according to any one of the supplementary descriptions 8 to 10, wherein preferably, in the first nitride semiconductor layer, electric resistivity is $1\times10^6$ Ωcm or more under a temperature condition of 20° C. or more and 200° C. or less. More preferably, electric resistivity is $1\times10^5$ Ωcm or more under a temperature condition of more than 200° C. and 400° C. or less.

(Supplementary Description 12)

There is provided the substrate according to any one of the supplementary descriptions 8 to 11, wherein preferably the −C-plane in the first nitride semiconductor layer is a mirror-polished plane.

(Supplementary Description 13)

There is provided the substrate according to any one of the supplementary descriptions 8 to 12, wherein preferably the −C-plane in the first nitride semiconductor layer has a portion into which the p-type impurity is to be injected.

(Supplementary Description 14)

According to another aspect of the present invention, there is provided a semiconductor device constituted using the nitride crystal substrate according to any one of supplementary descriptions 8 to 13, wherein a p-type region is formed in the first nitride semiconductor layer by ion-implantation of a p-type impurity into the −C-plane of the first nitride semiconductor layer, and the p-type region is used to form a pn-junction.

DESCRIPTIONS OF SIGNS AND NUMERALS

10 . . . GaN substrate (nitride semiconductor substrate),
20 . . . Seed crystal substrate,
21 . . . First GaN layer (first nitride semiconductor layer),
22 . . . Second GaN layer (second nitride semiconductor layer),
26 . . . p-type region

What is claimed is:

1. A method for manufacturing a GaN substrate comprising:

growing GaN crystal along a c-axis direction on a +C-plane of a seed crystal substrate formed of GaN crystal to form an $n^-$-type first GaN layer having an n-type impurity concentration that is relatively low;

growing the GaN crystal along the c-axis direction on the +C-plane of the first GaN layer to form an $n^+$-type second GaN layer having an n-type impurity concentration that is relatively high; and removing the seed crystal substrate and exposing a −C-plane of the first GaN layer to obtain as a semiconductor substrate a laminate of the first GaN layer and the second GaN layer, with the −C plane as a main surface, wherein an electric resistivity of the first GaN layer is 50 Ωcm or less under a temperature condition of 20° C. or more and 200° C. or less, and an electric resistivity of the second GaN layer is $2\times10^{-2}$ Ωcm or less under a temperature condition of 20° C. or more and 200° C. or less.

2. The method for manufacturing the GaN substrate according to claim 1, wherein, in the first GaN layer, the n-type impurity concentration in the GaN crystal is less than $1\times10^{17}$ at/cm$^3$.

3. The method for manufacturing the GaN substrate according to claim 1, wherein at least each of the first GaN layer and the second GaN layer is formed by a hydride vapor phase epitaxy method.

4. The method for manufacturing the GaN substrate according to claim 1, further comprising:

ion-implanting a p-type impurity into the −C-plane which is the main surface of the GaN substrate; and annealing the GaN substrate after ion-implanting.

5. The method for manufacturing the GaN substrate according to claim 4, wherein the annealing is performed in a high temperature region at 1200° C. or more.

6. The method for manufacturing the GaN substrate according to claim 1, wherein formation of the first GaN layer and formation of the second GaN layer are repeatedly performed to obtain a laminate structure in which the first GaN layer and the second GaN layer are alternately laminated and further to obtain a plurality of the GaN substrates from the laminate structure.

7. A GaN substrate constituted by a laminate of a first GaN layer formed of GaN crystal and a second GaN layer formed of GaN crystal, wherein the first GaN layer is of $n^-$-type having a −C-plane as an exposed plane, a concentration of an n-type impurity in the GaN crystal is relatively low, and the n-type impurity concentration in the GaN crystal is less than $1\times10^{17}$ at/cm$^3$, a concentration of an n-type impurity in the GaN crystal is relatively high in the second GaN layer, an electric resistivity of the first GaN layer is 50 Ωcm or less under a temperature condition of 20° C. or more and 200° C. or less, and an electric resistivity of the second GaN layer is $2\times10^{-2}$ Ωcm or less under a temperature condition of 20° C. or more and 200° C. or less.

8. The GaN substrate according to claim 7, wherein the −C-plane is a mirror-polished plane in the first GaN layer.

9. The GaN substrate according to claim 7, wherein the −C-plane in the first GaN layer has a portion into which the p-type impurity is to be injected.

\* \* \* \* \*